United States Patent
Yun et al.

(10) Patent No.: US 12,009,044 B2
(45) Date of Patent: Jun. 11, 2024

(54) MEMORY BUILT-IN SELF-TEST WITH AUTOMATED MULTIPLE STEP REFERENCE TRIMMING

(71) Applicant: Siemens Industry Software Inc., Plano, TX (US)

(72) Inventors: Jongsin Yun, Portland, OR (US); Martin Keim, Sherwood, OR (US)

(73) Assignee: Siemens Industry Software Inc., Plano, TX (US)

( * ) Notice: Subject to any disclaimer, the term of this patent is extended or adjusted under 35 U.S.C. 154(b) by 55 days.

(21) Appl. No.: 17/757,013

(22) PCT Filed: Aug. 28, 2020

(86) PCT No.: PCT/US2020/048341
§ 371 (c)(1),
(2) Date: Jun. 8, 2022

(87) PCT Pub. No.: WO2021/118658
PCT Pub. Date: Jun. 17, 2021

(65) Prior Publication Data
US 2023/0049928 A1     Feb. 16, 2023

Related U.S. Application Data

(60) Provisional application No. 62/945,457, filed on Dec. 9, 2019.

(51) Int. Cl.
| | | |
|---|---|---|
| *G11C 29/00* | (2006.01) | |
| *G06F 3/06* | (2006.01) | |
| *G11C 29/44* | (2006.01) | |

(52) U.S. Cl.
CPC ........ *G11C 29/4401* (2013.01); *G06F 3/0619* (2013.01); *G06F 3/0653* (2013.01); *G06F 3/0673* (2013.01)

(58) Field of Classification Search
CPC . G11C 29/4401; G06F 3/0619; G06F 3/0653; G06F 3/0673
See application file for complete search history.

(56) References Cited

U.S. PATENT DOCUMENTS

| | | |
|---|---|---|
| 8,694,854 B1 | 4/2014 | Dar et al. |
| 2016/0034206 A1 | 2/2016 | Ryan |

(Continued)

OTHER PUBLICATIONS

PCT International Search Report and Written Opinion of International Searching Authority dated Nov. 19, 2020 corresponding to PCT International Application No. PCT/US2020/048341 filed Aug. 28, 2020.

*Primary Examiner* — Samir W Rizk

(57) ABSTRACT

A memory device can sense stored data during memory read operations using a reference trim, and a memory built-in self-test system can perform a multiple step process to set the reference trim for the memory device. The memory built-in self-test system can set a reference trim range that corresponds to a range of available reference trim values and then select one of the reference trim values in the reference trim range as the reference trim for the memory device. The memory built-in self-test system can set the reference trim range by prompting performance of the memory read operations using different positions of the reference trim range relative to read characteristics of the memory device and set a position for the reference trim range relative to the read characteristics of the memory device based on failures of the memory device to correctly sense the stored data during the memory read operations.

17 Claims, 11 Drawing Sheets

(56) References Cited

U.S. PATENT DOCUMENTS

| | | |
|---|---|---|
| 2016/0284422 A9 | 9/2016 | Ong |
| 2016/0300609 A1 | 10/2016 | Han et al. |
| 2016/0314847 A1 | 10/2016 | Yang |
| 2019/0348130 A1 | 11/2019 | Reuter et al. |
| 2019/0355426 A1* | 11/2019 | Sheperek .............. G11C 29/028 |

* cited by examiner

REFERENCE TRIM RANGE SHIFT FOR MAGNETORESISTIVE MEMORY DEVICE

RESISTANCE SHIFT FOR MAGNETORESISTIVE MEMORY DEVICE

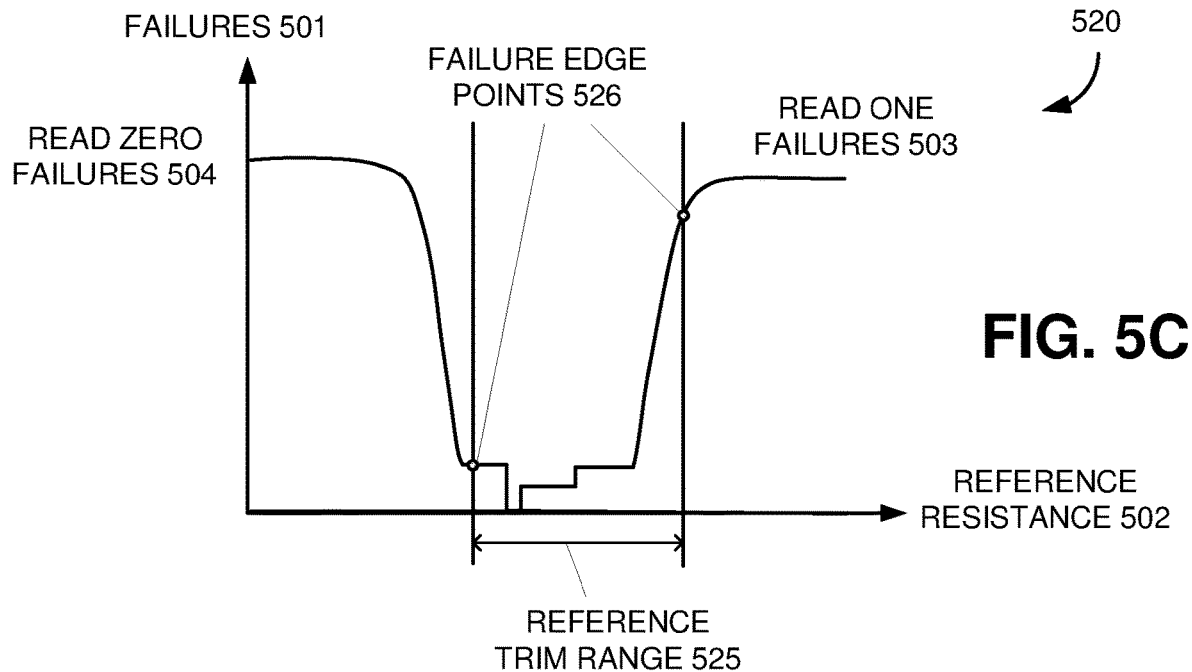
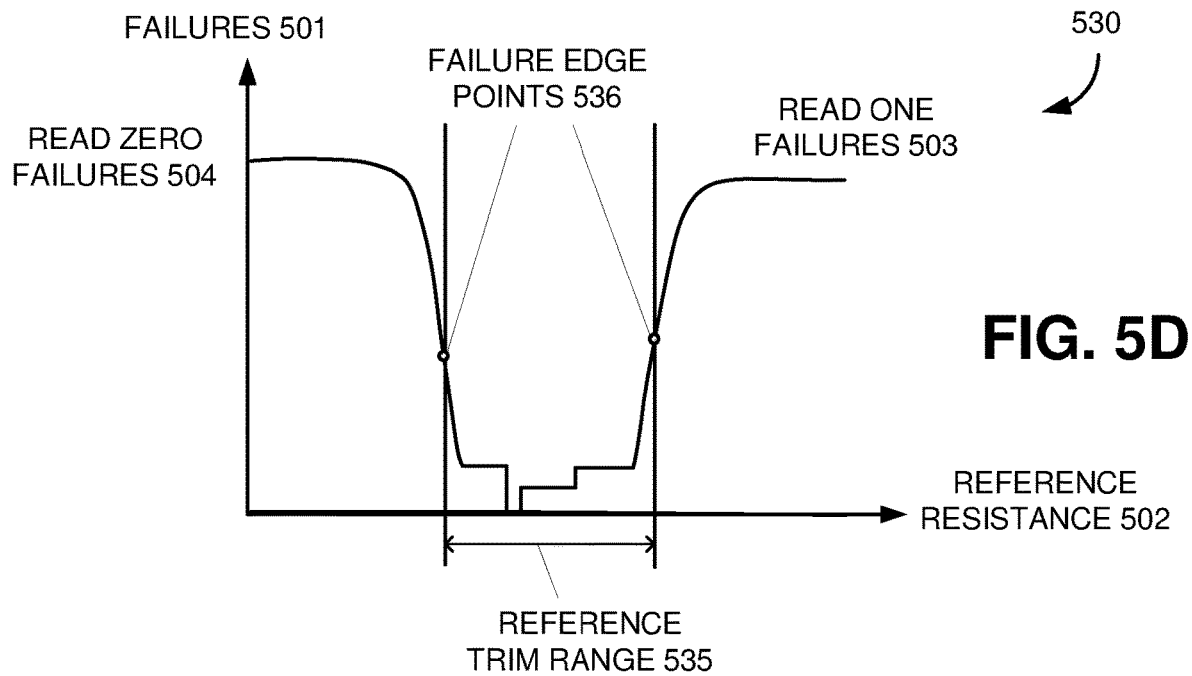

EXAMPLE AUTOMATED BIT LINE RESISTANCE SEARCH

EXAMPLE AUTOMATED BIT LINE RESISTANCE SEARCH

EXAMPLE FAILURE CHARACTERISTICS OF MAGNETORESISTIVE MEMORY DEVICE

EXAMPLE AUTOMATED TRIM VALUE SEARCH USING FAILURE TAILS

MEMORY BUILT-IN SELF-TEST WITH AUTOMATED MULTIPLE STEP REFERENCE TRIMMING

RELATED APPLICATION

This patent application claims priority to U.S. Provisional Patent Application No. 62/945,457, filed Dec. 9, 2019, which is incorporated by reference herein.

TECHNICAL FIELD

This application is generally related to electronic design automation and, more specifically, to memory built-in self-test with automated multiple step process to set a reference trim for a memory device.

BACKGROUND

Magnetoresistive Random Access Memory (MRAM) has become an attractive non-volatile memory solution due to its small size, fast operation speed, and good endurance. MRAM devices can store data in magnetic domains, for example, as a spin polarity of magnets in their free layers. A MRAM device can write data in a magnetic domain by setting the spin polarity of magnets in its free layer, for example, providing a spin-polarized current through Magnetic Tunnel Junction (MTJ), which exerts torque on local magnetization in the free layer, often called Spin Torque Transfer (STT).

To read the stored data, the MRAM device can ascertain the spin polarity of the magnets in its free layer relative to a pinned reference layer underneath the corresponding free layer. When the spin polarity is parallel to the pinned reference layer, a resistivity on a reference bit-line (BL) of the MRAM device can be deemed low and thus correspond to a data "0" value. When the spin polarity is perpendicular or anti-parallel to the pinned reference layer, the resistivity on the reference bit-line of the MRAM device can be deemed high and thus correspond to a data "1" value. The MRAM device can include sensing circuitry to detect the resistivity on the reference bit-line of the MRAM device and compare the detected resistivity against a reference resistance to determine whether to deem the detected resistivity as low corresponding to a data "0" value or as high corresponding to a data "1" value.

Many MRAM devices have relatively small resistivity separation between a high resistive state associated with a data "1" value and a low resistive state associated with a data "0" value, which can render reliable data read operations a challenge. To combat this lack of resistivity separation, some MRAM devices have included trim circuitry to adjust the reference resistance used by the MRAM devices to differentiate between high resistive states and low resistive states of its memory cells. The trim circuitry can receive an external input corresponding to a reference trim, for example, from test engineers, which can adjust the reference resistance that the MRAM devices compares against resistance values read from its memory cells in order to determine whether the memory cells stored data "1" values or data "0" values. Test engineers typically determine values for reference trims in MRAM devices through extensive testing over different environmental conditions, such as temperature variations, to identify a full distribution of bit properties for the MRAM device before performing engineering analysis to identify the reference trims. This MRAM device testing has proven costly or impractical in larger MRAM implementations.

SUMMARY

This application discloses a memory device to sense stored data during memory read operations using a reference trim, and a memory built-in self-test system to perform a multiple step process to set the reference trim for the memory device. The memory built-in self-test system can set a reference trim range that corresponds to a range of available reference trim values and then select one of the reference trim values in the reference trim range to set the reference trim for the memory device. The memory built-in self-test system can set the reference trim range by prompting the memory device to perform memory read operations using different positions of the reference trim range relative to read characteristics of the memory device, determine when the memory device fails to correctly sense the stored data during those read operations, and set a position for the reference trim range relative to the read characteristics of the memory device based on failures of the memory device to correctly sense the stored data. Embodiments will be described below in greater detail.

DESCRIPTION OF THE DRAWINGS

FIGS. 5A-5D illustrate graphs of an example automated trim range according to various embodiments.

DETAILED DESCRIPTION

Figure 1:
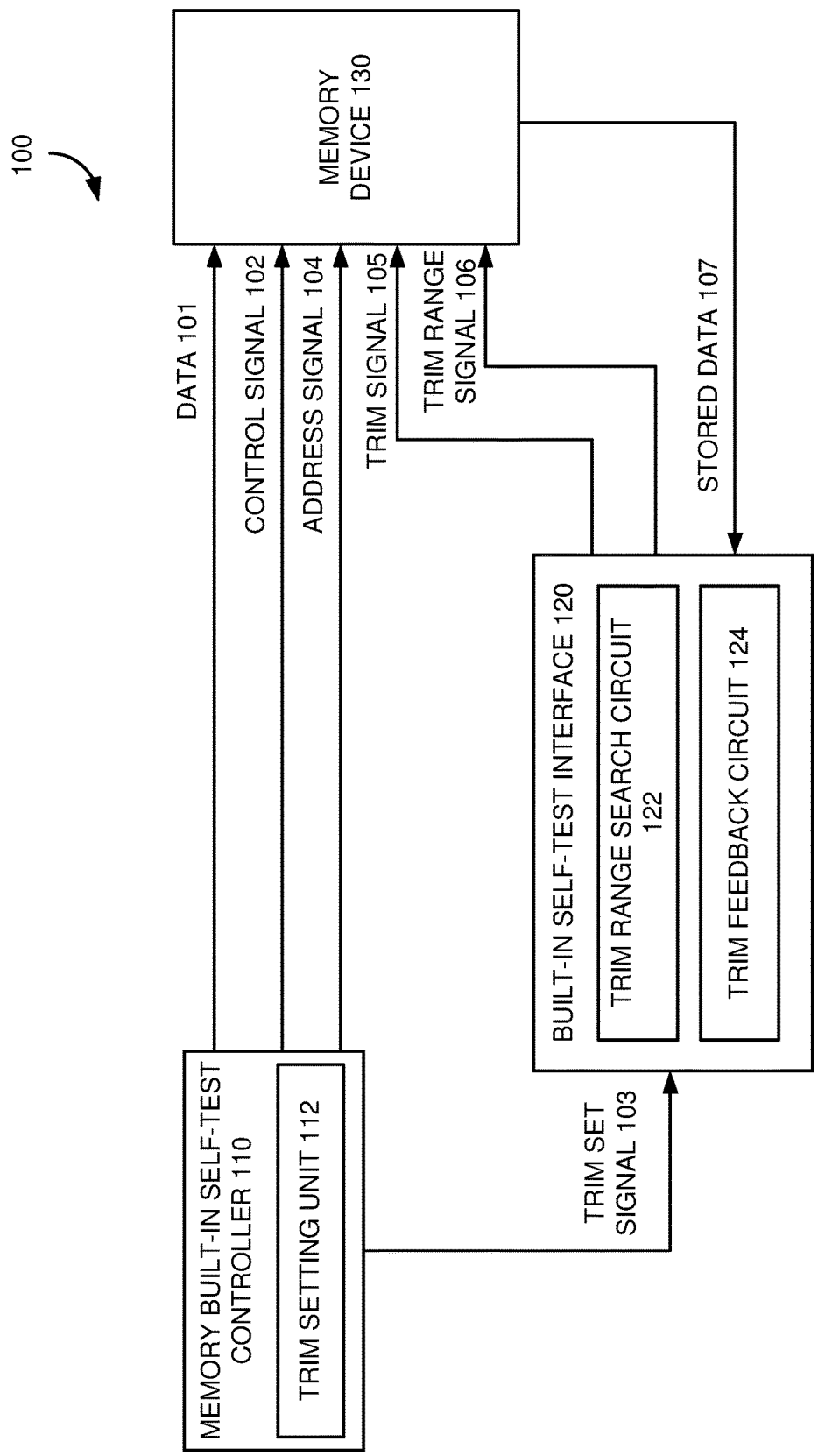
FIG. 1 illustrates an example memory system 100 including a memory built-in self-test with automated multiple step reference trimming process according to various embodiments.

Memory Built-In Self-Test with Automated Multiple Step Reference Trimming Process FIG. 1 illustrates an example memory system 100 including a memory built-in self-test with automated multiple step reference trimming process according to various embodiments. Referring to FIG. 1, the memory system 100 includes a memory device 130 to store data 101 during data write operations and to output stored data 107 during data read operations. In some embodiments, the memory device 130 can include a Magnetoresistive Random Access Memory (MRAM) to store the data 101 in magnetic domains, for example, as a spin polarity of magnets in a free layer. The Magnetoresistive Random Access Memory can be a Spin Torque Transfer (STT) MRAM device, which can write the data 101 by providing a spin-polarized current through Magnetic Tunnel Junction (MTJ), which exerts torque on local magnetization in the free layer. In other embodiments, the memory device 130 can include other types of Random Access Memory (RAM), such as Dynamic Random Access Memory (DRAM), Static Random Access Memory (SRAM), or the like, or include other types of non-volatile memory, such as Flash memory, Resistive Random Access Memory (ReRAM), or the like.

The memory system 100 can include a memory built-in self-test controller 110 to control memory access operations of the memory device 130. The memory built-in self-test controller 110 can generate a control signal 102 and an address signal 104 that, when provided to the memory device 130, can prompt the memory device 130 to perform a memory access operation, such as a data write operation or a data read operation at an address indicated by the address signal 104. When the control signal 102 corresponds to a data write operation, the memory device 130 can store the data 101 from the memory built-in self-test controller 110 at the address indicated by the address signal 104 in response to the control signal 102. When the control signal 102 corresponds to a data read operation, the memory device 130 can locate and output the stored data 107 at the address indicated by the address signal 104 in response to the control signal 102. The memory device 130 can read the stored data 107 by sensing an electric value, such as voltage, current, resistance, or the like, associated with a bit line of the memory device 130, and comparing the sensed electrical value against a reference value to determine whether the stored data 107 corresponding to a high data value associated with data "1" or a low data value associated with data "0". In some embodiments, one or more intermediate data values between may exist between the high data value and the low data value.

Since, in some instances, the reference value utilized by the memory device 130 to sense the data value of the stored data 107 can be misaligned with the electrical characteristics of one or more of the memory cells in the memory device 130, the memory device 130 can adjust the reference value with a reference trim, for example, determined by the memory device 130 based on a trim signal 105 and a trim range signal 106. The memory device 130 can utilize the adjusted reference value to determine whether the stored data 107 corresponds to a high data value or a low data value. An example of read characteristics of a magnetoresistive memory device using a reference trim value is described below with reference to FIG. 2.

Figure 2:
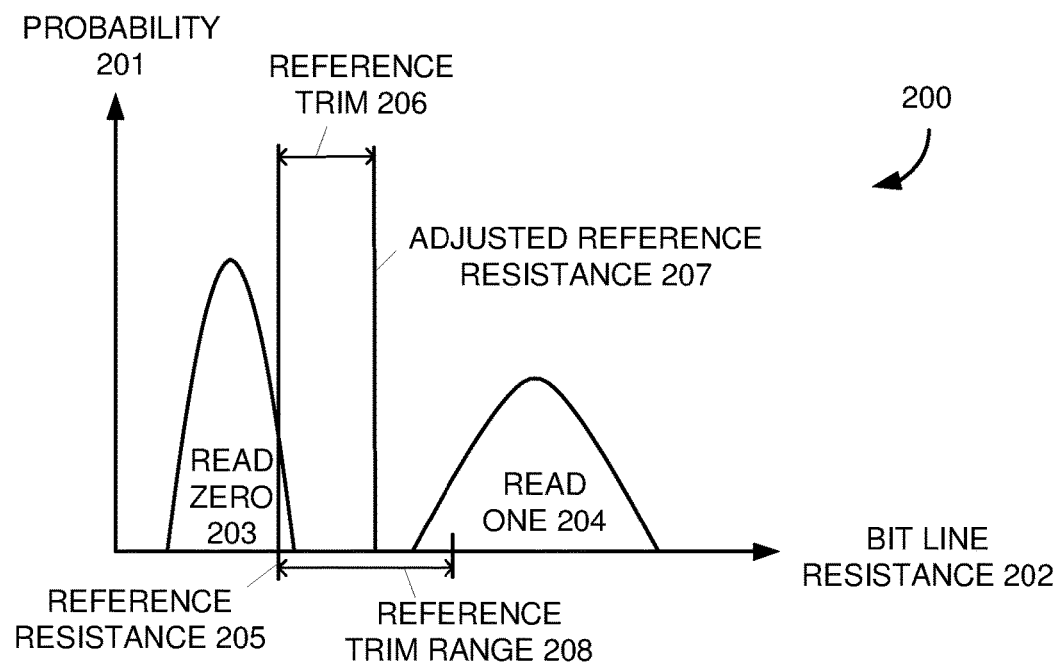
FIG. 2 illustrates a graph of example read characteristics of a magnetoresistive memory device according to various embodiments.

FIG. 2 illustrates a graph 200 of example read characteristics of a magnetoresistive memory device according to various embodiments. Referring to FIG. 2, the graph 200 has an x-axis corresponding to bit line resistances 202 during read operations of the magnetoresistive memory device and has a y-axis corresponding to a probability 201 or likelihood of occurrence for each of the bit line resistances 202. In this example, the read characteristics can include two groupings, one for bit line resistances associated with reading a stored data "0" value or read zero 203 and another for bit line resistances associated with reading a stored data "1" value or read one 204.

The magnetoresistive memory device also can include a reference resistance 205 value that can be utilized to determine whether a sensed bit line resistance value corresponds to a stored data "0" value or a stored data "1" value stored in the magnetoresistive memory device. In the instant example, the reference resistance 205 falls within a range corresponding to bit line resistances associated with reading a stored data "0" value or read zero 203, meaning the magnetoresistive memory device could sense a resistance of a stored data "0" value and use the reference resistance 205 to incorrectly associate it with a stored data "1" value. In some instances, the magnetoresistive memory device can adjust the reference resistance 205 using a reference trim 206 within a reference trim range 208 to generate an adjusted reference resistance. The reference trim range 208 can correspond to a range that the reference resistance 205 can be adjusted with a value of the reference trim 206. The adjusted reference resistance can be located between the read zero 203 and the read one 204 characteristics of the magnetoresistive memory device.

There can be situations where the reference resistance 205 and any value of the reference trim 206 in the reference trim range 208 would not lead to an adjusted reference resistance 207 falling between the read zero 203 and the read one 204 characteristics of the magnetoresistive memory device. As will be described below in greater detail, the magnetoresistive memory device can set a location of the reference trim range 208 relative to the bit line resistance 202 of the read zero 203 and read one 204 characteristics of the magnetoresistive memory device, such that at least one of the values for the reference trim 206 in the reference trim range 208 would lead to an adjusted reference resistance falling between the read zero 203 and the read one 204 characteristics of the magnetoresistive memory device.

Referring back to FIG. 1, the memory system 100 can include a built-in self-test interface 120 to generate the trim signal 105 and the trim range signal 106 for the memory device 130. The trim range signal 106 can correspond to a location for a reference trim range relative to the read characteristics of the memory device 130. In some embodiments, the trim range signal 106 can prompt the memory device 130 to set or shift a location of the reference trim range while keeping the read characteristics for the memory device 130 the same, for example, when the memory device 130 has no control input on the bit lines of memory cells. In other embodiments, the trim range signal 106 can prompt the memory device 130 to set or shift the read characteristics of the memory device 130 while keeping the location of the reference trim range the same, for example, when the memory device 130 includes a control input on the bit lines of memory cells, such as dual bit line memory cells. Both of these embodiments will be described below in greater detail.

The trim signal 105 can be used by the memory device 130 to select a value for the reference trim within the reference trim range and to set the reference value for the memory device 130 with the reference trim value. The memory device 130 can utilize the reference value during memory read operations, for example, to sense whether stored data corresponds to a high data value or a low data value. In some embodiments, the value for the reference trim can correspond to a resistance value, a voltage value, a current value, or the like, which can be used to adjust a reference resistance, a reference voltage, a reference current, respectively.

The built-in self-test interface 120 can provide the trim signal 105 and the trim range signal 106 to the memory device 130. The memory device 130 can utilize the trim range signal 106 to perform a relative shift between the reference trim range and the read characteristics of the memory device 130, and utilize the value in the trim signal 105 to identify a reference trim value within the reference trim range. The memory device 130 can adjust the reference value used to read the stored data 107 based on the reference trim value.

The memory built-in self-test controller 110 can include a trim setting unit 112 to initiate a two-step process to automatically identify values for the trim signal 105 and the trim range signal 106, for example, by identifying a location for reference trim range relative to the read characteristics of the memory device 130 and then identifying a value in the reference trim range to set as the reference trim. The trim setting unit 112 can write test data, such as the data 101, to the memory device 130, for example, by generating the control signal 102 and the address signal 104 to prompt the memory device 130 to perform data write operations with the data 101. In some embodiments, the trim setting unit 112 can write the same data value to memory cells in the memory device 130, such as a data "1" or a data "0".

The trim setting unit 112 also can generate a trim set signal 103 to prompt the built-in self-test interface 120 to select the values for the trim signal 105 and the trim range signal 106 and provide the selected value to the memory device 130 in a trim signal 105. The trim setting unit 112 can prompt the memory device 130 to perform data read operations and output the test data, such as the stored data 107, using the value for the reference trim in the trim signal 105. The built-in self-test interface 120 can determine when the memory device 130 fails to output the stored data 107 with the same value as the data 101. In some embodiments, the built-in self-test interface 120 can compare the stored data 107 read from the memory device 130 to a type of the test data, such as a data "1" value or a data "0" value, and detect failures by the memory device 130 to output the stored data 107 with the correct value based on the comparison.

The built-in self-test interface 120 can include a trim range circuit 122 to determine a value for the trim range signal 106, which can allow the memory device 130 to set the reference trim range relative to the read characteristic of the memory device 130. The trim setting unit 112 and the trim range circuit 122 can iteratively write the test data to the memory device 130 and read the test data from the memory device 130 with different values for the trim signal 105 and the trim range signal 106, which can allow the trim range circuit 122 determine a location for the reference trim range relative to the read characteristic of the memory device 130 and set a value for the trim range signal 106. Embodiments of the automated reference trim range setting process will be described in greater detail both with reference to FIG. 3.

Figure 3:
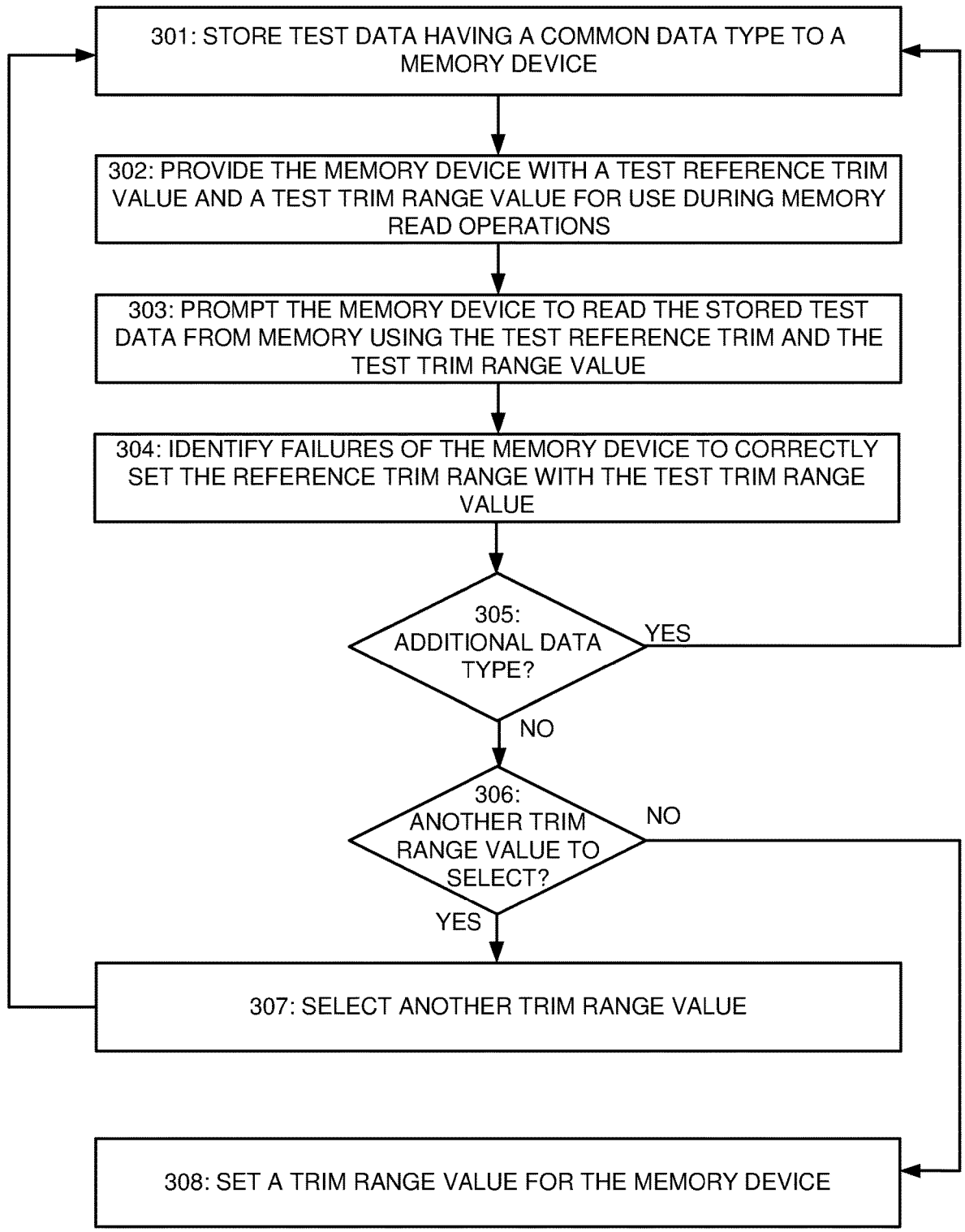
FIG. 3 illustrates a flowchart showing an example implementation of an automated reference trim range shift process according to various embodiments.

FIG. 3 illustrates a flowchart showing an example implementation of an automated reference trim range shift process according to various embodiments. Referring to FIG. 3, in a block 301, a memory built-in self-test system can store test data having a common data type to a memory device. The memory built-in self-test system can write the test data to the memory device by generating a control signal and an address signal to prompt the memory device to perform data write operations with the test data. In some embodiments, the memory built-in self-test system can write the same data value to memory cells in the memory device, such as all data "1" values or all data "0" values.

In a block 302, the memory built-in self-test system can generate the memory device with a test reference trim value and a test trim range value for use during memory read operations. The memory device can utilize the test trim range value to set a location of the reference trim range relative to the read characteristics of the memory device. The memory device can utilize the test reference trim value to set a reference trim within a reference trim range of the memory device. In some embodiments, the test trim range value can prompt the memory device to set or shift a location of the reference trim range while keeping the read characteristics for the memory device the same, for example, when the memory device has no control input on the bit lines of memory cells. In other embodiments, the test trim range signal can prompt the memory device to set or shift the read characteristics of the memory device while keeping the location of the reference trim range the same, for example, when the memory device includes a control input on the bit lines of memory cells, such as dual bit line memory cells. These embodiments will be described below in greater detail with reference to FIGS. 4A and 4B.

Figure 4A:
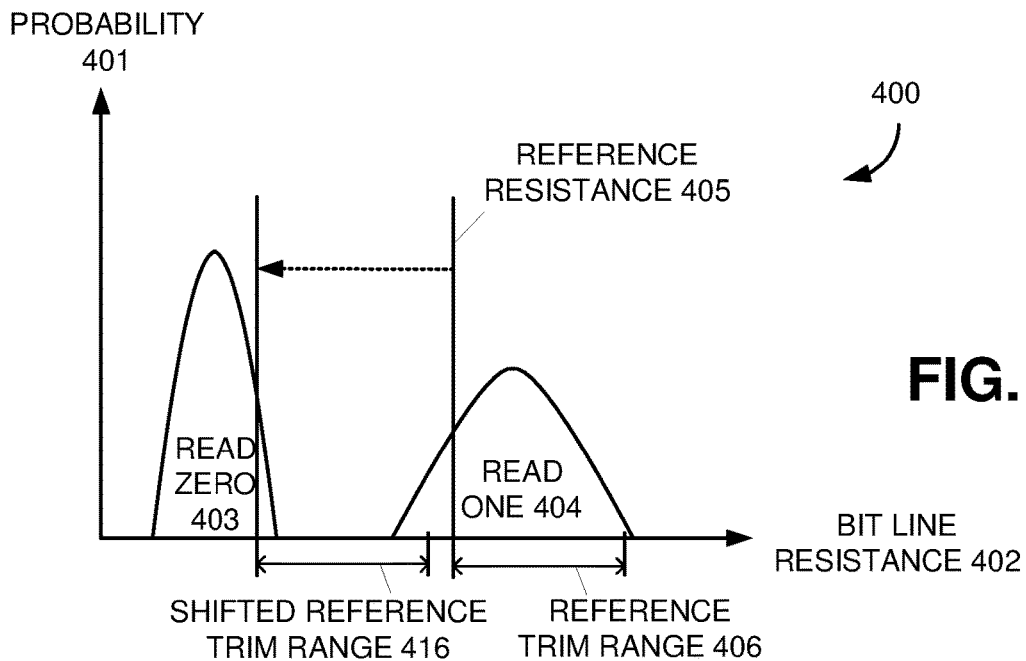
FIGS. 4A and 4B illustrate graphs of example reference trim range shifts relative reference selection results according to various embodiments.
Figure 4B:
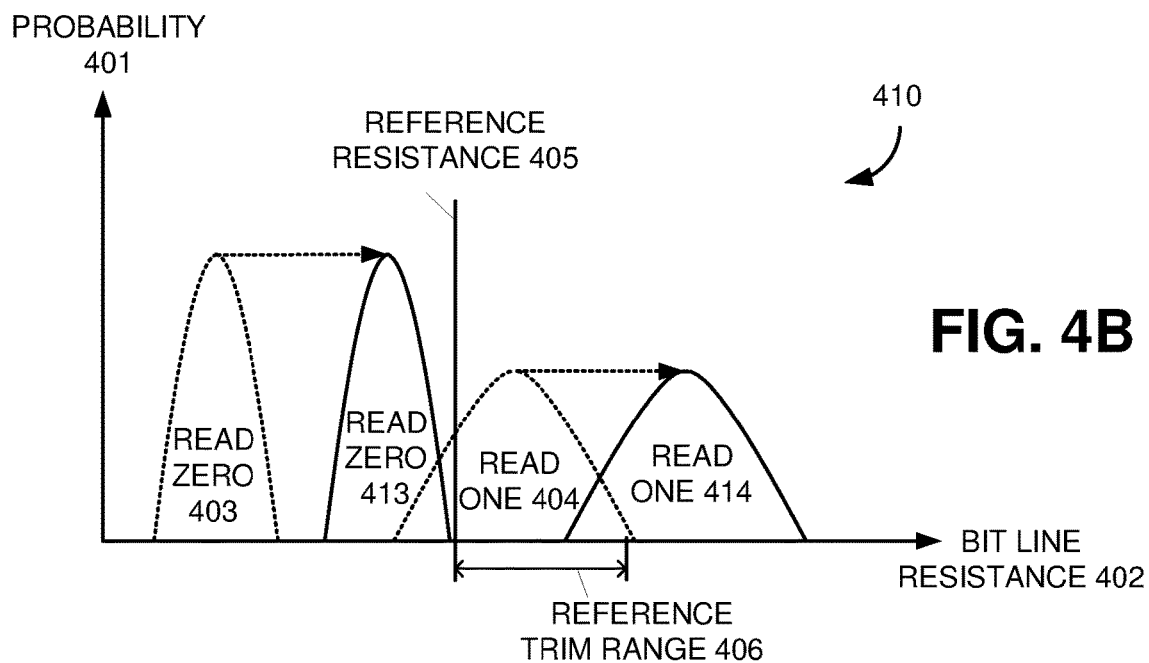

FIGS. 4A and 4B illustrate graphs of example reference trim range shifts relative reference selection results according to various embodiments. Referring to FIG. 4A, the graph 400 has an x-axis corresponding to bit line resistances 402 during read operations of the magnetoresistive memory device and has a y-axis corresponding to a probability 401 or likelihood of occurrence for each of the bit line resistances 402. In this example, the read characteristics can include two groupings, one for bit line resistances associated with reading a stored data "0" value or read zero 403 and another for bit line resistances associated with reading a stored data "1" value or read one 404.

The magnetoresistive memory device also can include a reference resistance 405 that can be utilized to determine whether a sensed bit line resistance value corresponds to a stored data "0" value or a stored data "1" value stored in the magnetoresistive memory device. The magnetoresistive memory device can adjust the reference resistance 405 within a reference trim range 406 to generate an adjusted reference resistance. The reference trim range 406 can correspond to a range that the reference resistance 405 can be adjusted with a value of the reference trim 406.

The magnetoresistive memory device can utilize a trim range value to shift a location of the reference trim range 406 relative to the bit line resistance 402 of the magnetoresistive memory device, shown as a shifted reference trim range 416. In some embodiments, the magnetoresistive memory device can utilize the trim range value to adjust an offset bias current for a bit line in the magnetoresistive memory device, which can shift the reference trim range 406 to correspond to a new set of the bit line resistances 402 at the shifted reference trim range 416.

Referring to FIG. 4B, the graph 410 has an x-axis corresponding to bit line resistances 402 during read operations of the magnetoresistive memory device and has a y-axis corresponding to a probability 401 or likelihood of occurrence for each of the bit line resistances 402. In this example, the read characteristics can include two groupings, one for bit line resistances associated with reading a stored data "0" value or read zero 403 and another for bit line resistances associated with reading a stored data "1" value or read one 404.

The magnetoresistive memory device also can include a reference resistance 405 that can be utilized to determine whether a sensed bit line resistance value corresponds to a stored data "0" value or a stored data "1" value stored in the magnetoresistive memory device. The magnetoresistive memory device can adjust the reference resistance 405 within a reference trim range 406 to generate an adjusted reference resistance. The reference trim range 406 can correspond to a range that the reference resistance 405 can be adjusted with a value of the reference trim 406.

The magnetoresistive memory device can utilize a trim range value to shift the bit line resistance 402 of the read zero 403 and the read one 404 for the magnetoresistive memory device to a read zero 413 and a read one 414, respectively. In some embodiments, the magnetoresistive memory device can have a dual bit line memory cell with an active bit line and a reference bit line, and can utilize the trim range value to adjust a current for the active bit line to shift the memory read characteristics—read zero 403 and the read one 404—to read zero 413 and read one 414.

Referring back to FIG. 3, in a block 303, the memory built-in self-test system can prompt the memory device to read the stored test data from memory using the test reference trim and the trim range value. The memory built-in self-test system can generate a control signal to prompt the memory device to perform data read operations at memory locations identified by an address signal. In response to the control signal, the memory device can sense the stored test data and compare the sensed data against a reference value to determine values for the stored test data. The memory device can set the reference value using the test reference trim and the test trim range value. In some embodiments, the test reference trim can correspond to an edge of the test reference trim range. For example, when the common data type corresponds to a low data value or a data "0" value, the test reference trim can have a lowest value in the test trim range. Conversely, when the common data type corresponds to a high data value or a data "1" value, the test reference trim can have a highest value in the test trim range.

In a block 304, the memory built-in self-test system can identify failures of the memory device to correctly read the stored data using the test reference trim and the trim range value. The memory built-in self-test system can compare the data read from the memory device against the common data type of the stored data to determine whether the memory device correctly read the stored data using the test reference trim. The memory built-in self-test system can accumulate the failures of the memory device to correctly read the stored data using the test reference trim and store them as a hard failure count for the common data type set in the block 301.

In a block 305, the memory built-in self-test system can determine whether to store a different data type to the memory device. When the memory built-in self-test system has accumulated failures for one data type, execution can proceed back to the block 301 and the memory built-in self-test system can store a different data type to the memory device.

When the memory built-in self-test system has accumulated failures for the data types capable of being stored by the memory device, execution can proceed to a block 306, where the memory built-in self-test system can determine whether there is another trim range value to select. In some embodiments, the memory built-in self-test system can compare the accumulated failures determined in the block 304 and then identify a direction to possibly shift the reference trim range based on the comparison. In some embodiments, the memory built-in self-test system can identify the direction to possibly shift the reference trim range as being towards the reference value having a lower number of accumulated failures.

When the memory built-in self-test system determines to shift the reference trim range in the identified direction, for example, when an adjacent reference trim range location in that direction has not been tested previously, execution can proceed to a block 307, where the memory built-in self-test system can select another test trim range value. In some embodiments, the memory built-in self-test system can select the test trim range value to shift the location of the reference trim range relative to the read characteristics of the memory device in the direction identified in the block 306.

When the memory built-in self-test system determines not to shift the reference trim range in the identified direction, for example, when the adjacent reference trim range location in that direction has been tested previously, execution can proceed to a block 308, the memory built-in self-test system can set a trim range value for the memory device. In some embodiments, the memory built-in self-test system can set the trim range value for the memory device as one of the test reference trim value or the reference trim value corresponding to the adjacent reference trim range location in identified direction. Embodiments of the setting the reference trim range signal will be described below in greater detail.

Figure 5A:
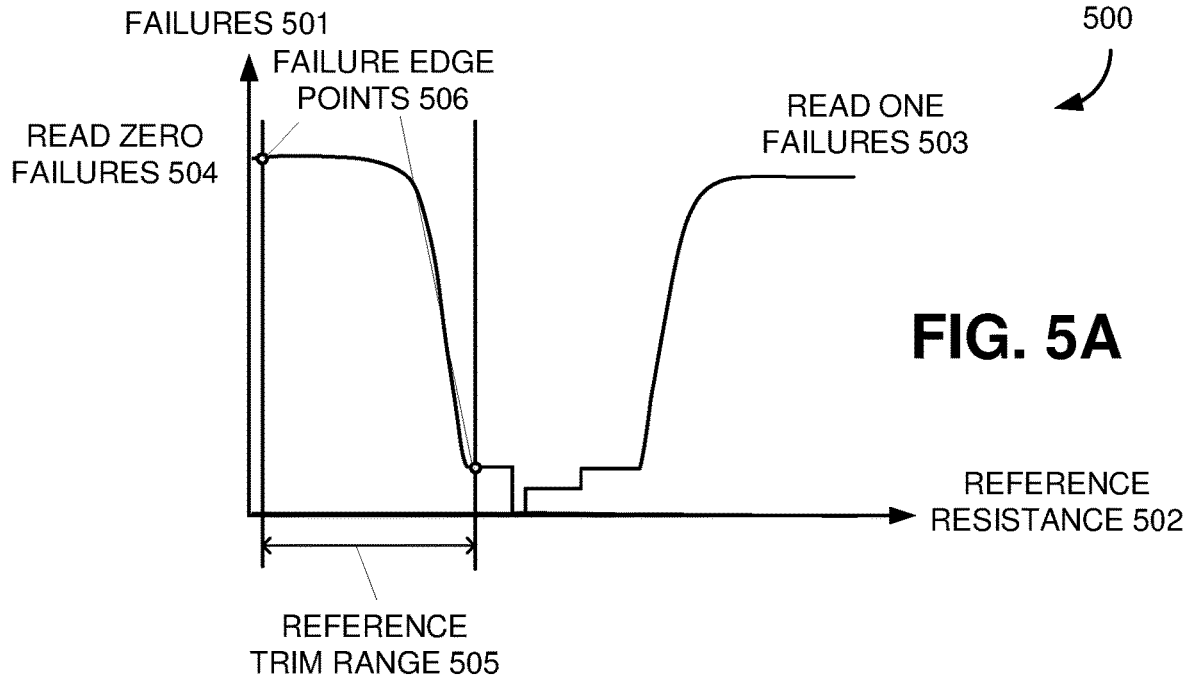

FIGS. 5A-5D illustrate graphs of an example automated trim range setting according to various embodiments. Referring to FIGS. 5A, the graph 500 has an x-axis corresponding to reference resistances 502 used by magnetoresistive memory device during read operations and has a y-axis corresponding to accumulated failures 501 of read operations using the various reference resistances 502. The reference resistances 502 can include a reference trim range 505 corresponding to a set of the reference resistances 502 available to the magnetoresistive memory device during read operations. The magnetoresistive memory device can utilize a reference trim value to select one of the reference resistances 502 within the reference trim range 505 to use during read operations.

In this example, the graph 500 shows read zero failures 504 and read one failures 503. The read zero failures 504 can correspond to a number of accumulated failures of the memory device to correctly read a data value of "0" using the various reference resistances. The read one failures 503 can correspond to a number of accumulated failures of the memory device to correctly read a data value of "1" using the various reference resistances.

During the automated trim range setting process, the magnetoresistive memory device can read a data value of "0" using a reference trim value at the lower boundary of the reference trim range 505 and can read a data value of "1" using a reference trim value at the upper boundary of the reference trim range 505. The accumulated failures for these read operations can correspond to failure boundary points 506. The automated trim range setting process can utilize the magnitudes of the failure boundary points 506 to determine a direction to shift the reference trim range 505 for subsequent read operations by the magnetoresistive memory device. In this example, the automated trim range setting process should shift the reference trim range 505 to a higher set of reference resistance values.

Figure 5B:
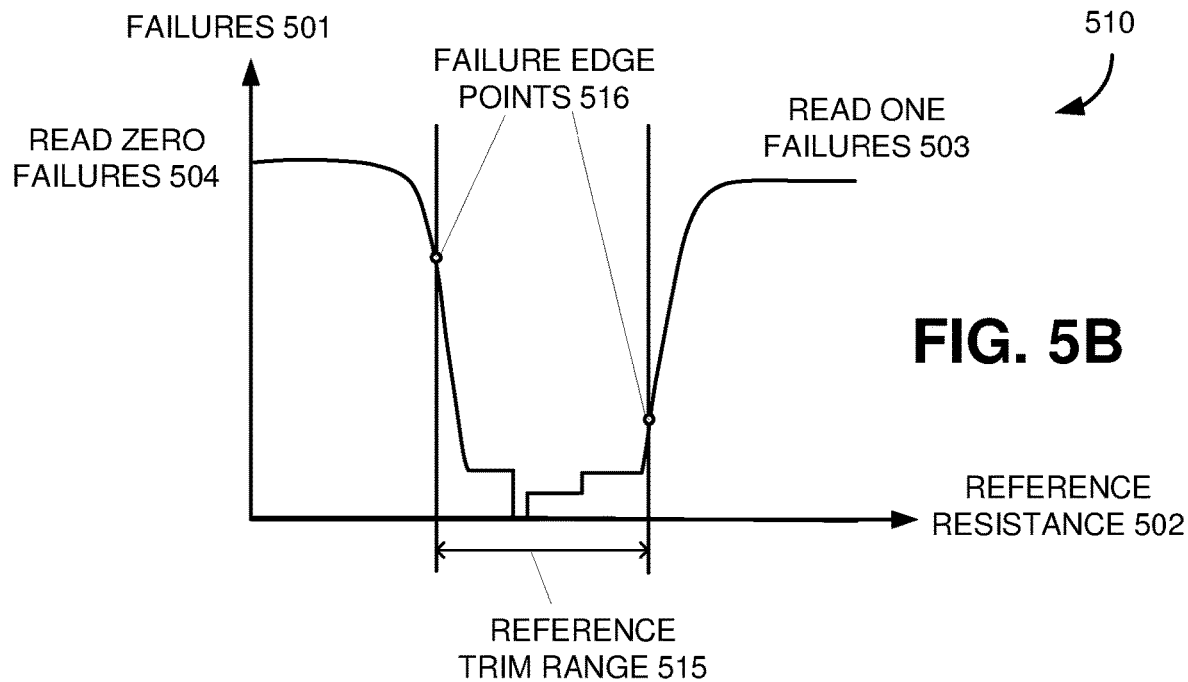

Referring to FIGS. 5B, the graph 510 has an x-axis corresponding to reference resistances 502 used by magnetoresistive memory device during read operations and has a y-axis corresponding to accumulated failures 501 of read operations using the various reference resistances 502. The reference resistances 502 can include a reference trim range 515 corresponding to a set of the reference resistances 502 available to the magnetoresistive memory device during read operations. The automated trim range setting process had shifted the reference trim range 505 in FIG. 5A to a high set of reference resistance values, as shown by the reference trim range 515. The magnetoresistive memory device can utilize a reference trim value to select one of the reference resistances 502 within the reference trim range 515 to use during read operations.

In this example, the graph 510 shows read zero failures 504 and read one failures 503. The read zero failures 504 can correspond to a number of accumulated failures of the memory device to correctly read a data value of "0" using the various reference resistances. The read one failures 503 can correspond to a number of accumulated failures of the memory device to correctly read a data value of "1" using the various reference resistances.

During the automated trim range setting process, the magnetoresistive memory device can read a data value of "0" using a reference trim value at the lower boundary of the reference trim range 515 and can read a data value of "1" using a reference trim value at the upper boundary of the reference trim range 515. The accumulated failures for these read operations can correspond to failure boundary points 516. The automated trim range setting process can utilize the magnitudes of the failure boundary points 516 to determine a direction to shift the reference trim range 515 for subsequent read operations by the magnetoresistive memory device. In this example, the automated trim range setting process should shift the reference trim range 515 to a higher set of reference resistance values.

Referring to FIGS. 5C, the graph 520 has an x-axis corresponding to reference resistances 502 used by magnetoresistive memory device during read operations and has a y-axis corresponding to accumulated failures 501 of read operations using the various reference resistances 502. The reference resistances 502 can include a reference trim range 525 corresponding to a set of the reference resistances 502 available to the magnetoresistive memory device during read operations. The automated trim range setting process had shifted the reference trim range 515 in FIG. 5B to a high set of reference resistance values, as shown by the reference trim range 525. The magnetoresistive memory device can utilize a reference trim value to select one of the reference resistances 502 within the reference trim range 525 to use during read operations.

In this example, the graph 520 shows read zero failures 504 and read one failures 503. The read zero failures 504 can correspond to a number of accumulated failures of the memory device to correctly read a data value of "0" using the various reference resistances. The read one failures 503 can correspond to a number of accumulated failures of the memory device to correctly read a data value of "1" using the various reference resistances.

During the automated trim range setting process, the magnetoresistive memory device can read a data value of "0" using a reference trim value at the lower boundary of the reference trim range 525 and can read a data value of "1" using a reference trim value at the upper boundary of the reference trim range 525. The accumulated failures for these read operations can correspond to failure boundary points 526. The automated trim range setting process can utilize the magnitudes of the failure boundary points 526 to determine a direction to shift the reference trim range 525 for subsequent read operations by the magnetoresistive memory device. In this example, the automated trim range setting process should shift the reference trim range 525 to a lower set of reference resistance values.

Referring to FIGS. 5D, the graph 530 has an x-axis corresponding to reference resistances 502 used by magnetoresistive memory device during read operations and has a y-axis corresponding to accumulated failures 501 of read operations using the various reference resistances 502. The reference resistances 502 can include a reference trim range 535 corresponding to a set of the reference resistances 502 available to the magnetoresistive memory device during read operations. The automated trim range setting process had shifted the reference trim range 525 in FIG. 5C to a lower set of reference resistance values, as shown by the reference trim range 535. The magnetoresistive memory device can utilize a reference trim value to select one of the reference resistances 502 within the reference trim range 535 to use during read operations.

In this example, the graph 530 shows read zero failures 504 and read one failures 503. The read zero failures 504 can correspond to a number of accumulated failures of the memory device to correctly read a data value of "0" using the various reference resistances. The read one failures 503 can correspond to a number of accumulated failures of the memory device to correctly read a data value of "1" using the various reference resistances.

During the automated trim range setting process, the magnetoresistive memory device can read a data value of "0" using a reference trim value at the lower boundary of the reference trim range 535 and can read a data value of "1" using a reference trim value at the upper boundary of the reference trim range 535. The accumulated failures for these read operations can correspond to failure boundary points 536. The automated trim range setting process can utilize the magnitudes of the failure boundary points 536 to determine a direction to shift the reference trim range 535 for subsequent read operations by the magnetoresistive memory device. In this example, the automated trim range setting process determines that a shift to the reference trim range 535 to a lower set of reference resistance values was previously performed with reference to FIG. 5C, so the automated trim range setting process selected the reference trim range 525 or the reference trim range 535 as the setting of the reference trim range for the magnetoresistive memory device.

Figure 6A:
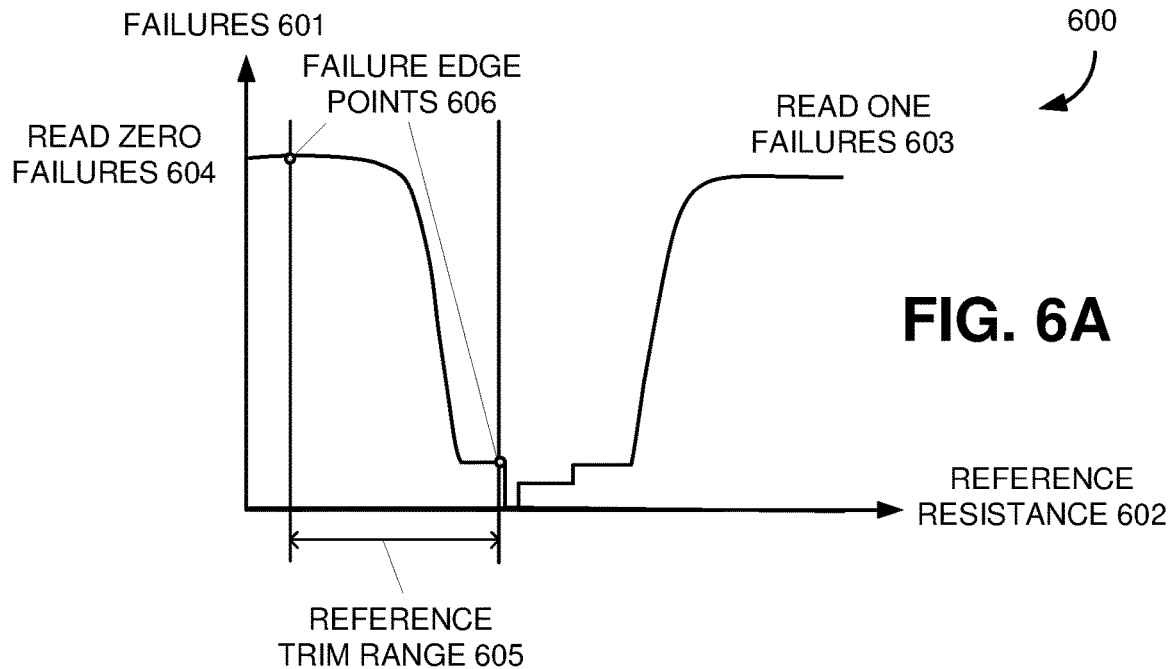
FIGS. 6A-6D illustrate graphs of an example automated bit line resistance search process according to various embodiments.

FIGS. 6A-6D illustrate graphs of an example automated bit line resistance search process according to various embodiments. Referring to FIGS. 6A, the graph 600 has an x-axis corresponding to reference resistances 602 used by magnetoresistive memory device during read operations and has a y-axis corresponding to accumulated failures 601 of read operations using the various reference resistances 602. The reference resistances 602 can include a reference trim range 605 corresponding to a set of the reference resistances 602 available to the magnetoresistive memory device during read operations. The magnetoresistive memory device can utilize a reference trim value to select one of the reference resistances 602 within the reference trim range 605 to use during read operations.

In this example, the graph 600 shows read zero failures 604 and read one failures 603. The read zero failures 604 can correspond to a number of accumulated failures of the memory device to correctly read a data value of "0" using the various reference resistances. The read one failures 603 can correspond to a number of accumulated failures of the memory device to correctly read a data value of "1" using the various reference resistances.

During the automated bit line resistance search process, the magnetoresistive memory device can read a data value of "0" using a reference trim value at the lower boundary of the reference trim range 605 and can read a data value of "1" using a reference trim value at the upper boundary of the reference trim range 605. The accumulated failures for these read operations can correspond to failure boundary points 606. The automated bit line resistance search process can utilize the magnitudes of the failure boundary points 606 to determine a direction to shift in the read characteristics of the magnetoresistive memory device for subsequent read operations. In this example, the automated bit line resistance search process should shift the read characteristics of the magnetoresistive memory device to lower reference resistance values due to the relative magnitudes of the accumulated failures.

Figure 6B:
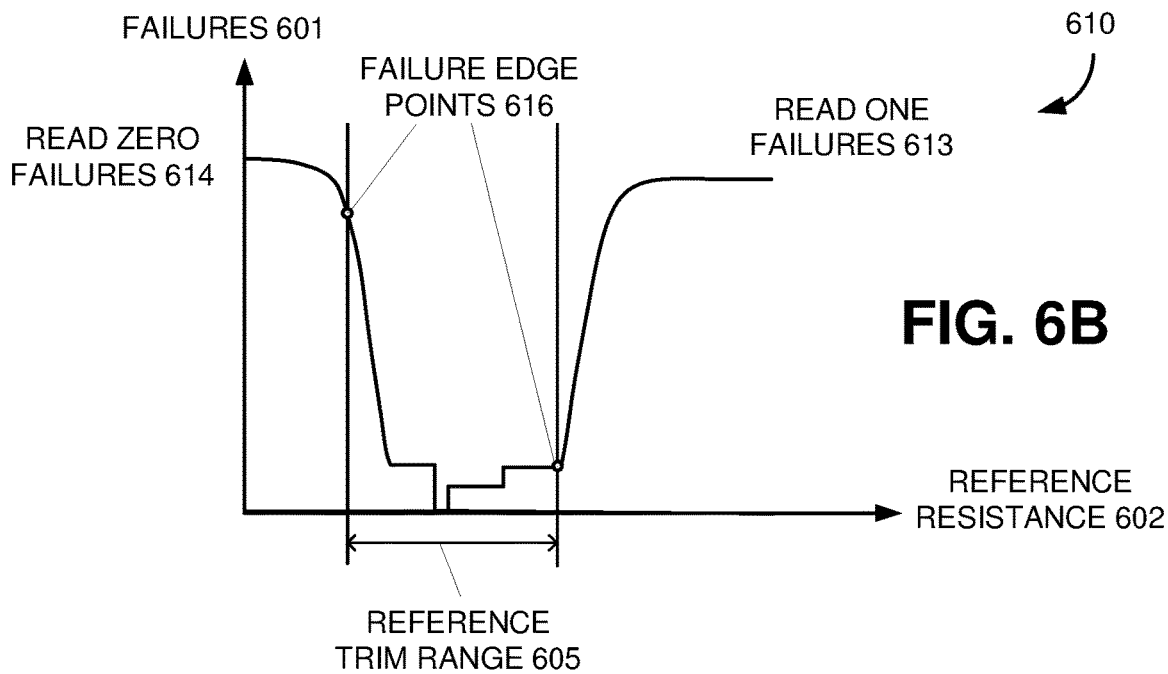

Referring to FIGS. 6B, the graph 610 has an x-axis corresponding to reference resistances 602 used by magnetoresistive memory device during read operations and has a y-axis corresponding to accumulated failures 601 of read operations using the various reference resistances 602. The reference resistances 602 can include a reference trim range 605 corresponding to a set of the reference resistances 602 available to the magnetoresistive memory device during read operations. The magnetoresistive memory device can utilize a reference trim value to select one of the reference resistances 602 within the reference trim range 605 to use during read operations.

In this example, the graph 610 shows read zero failures 614 and read one failures 613, which have been shifted from the read zero failures 604 and read one failures 603, respectively, in FIG. 6A. The read zero failures 614 can correspond to a number of accumulated failures of the memory device to correctly read a data value of "0" using the various reference resistances. The read one failures 613 can correspond to a number of accumulated failures of the memory device to correctly read a data value of "1" using the various reference resistances.

During the automated bit line resistance search process, the magnetoresistive memory device can read a data value of "0" using a reference trim value at the lower boundary of the reference trim range 605 and can read a data value of "1" using a reference trim value at the upper boundary of the reference trim range 605. The accumulated failures for these read operations can correspond to failure boundary points 616. The automated bit line resistance search process can utilize the magnitudes of the failure boundary points 616 to determine a direction to shift in the read characteristics of the magnetoresistive memory device for subsequent read operations. In this example, the automated bit line resistance search process should shift the read characteristics of the magnetoresistive memory device to lower reference resistance values due to the relative magnitudes of the accumulated failures.

Figure 6C:
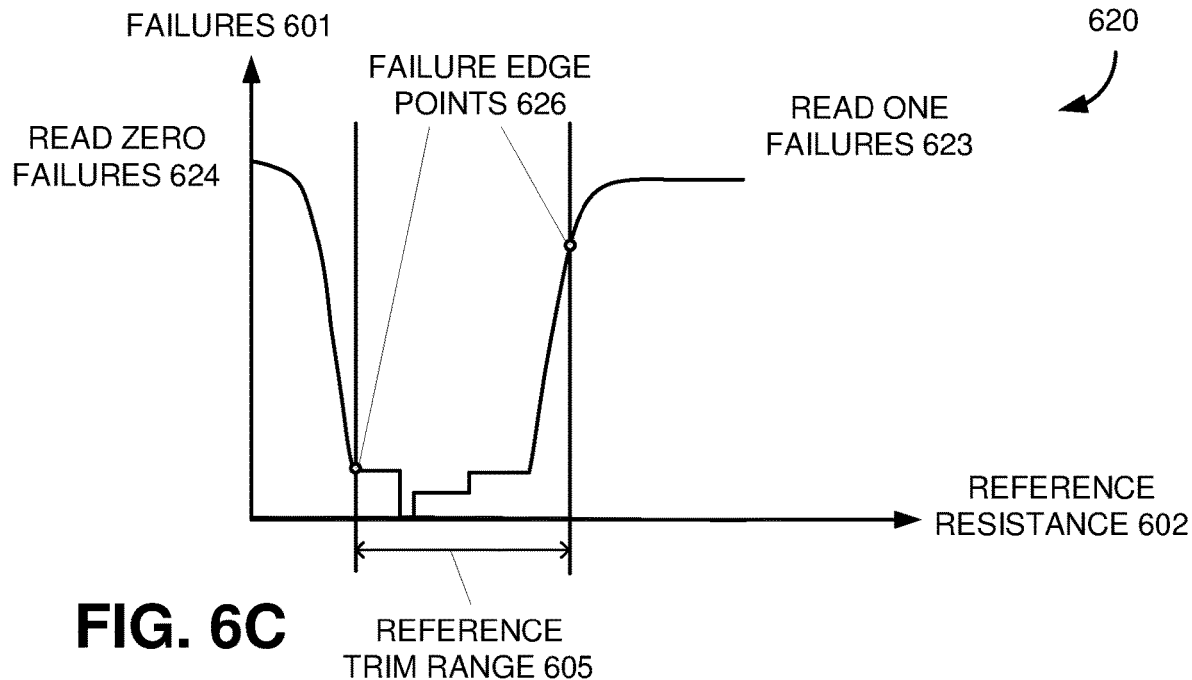

Referring to FIGS. 6C, the graph 620 has an x-axis corresponding to reference resistances 602 used by magnetoresistive memory device during read operations and has a y-axis corresponding to accumulated failures 601 of read operations using the various reference resistances 602. The reference resistances 602 can include a reference trim range 605 corresponding to a set of the reference resistances 602 available to the magnetoresistive memory device during read operations. The magnetoresistive memory device can utilize a reference trim value to select one of the reference resistances 602 within the reference trim range 605 to use during read operations.

In this example, the graph 620 shows read zero failures 624 and read one failures 623, which have been shifted from the read zero failures 614 and read one failures 613, respectively, in FIG. 6B. The read zero failures 624 can correspond to a number of accumulated failures of the memory device to correctly read a data value of "0" using the various reference resistances. The read one failures 623 can correspond to a number of accumulated failures of the memory device to correctly read a data value of "1" using the various reference resistances.

During the automated bit line resistance search process, the magnetoresistive memory device can read a data value of "0" using a reference trim value at the lower boundary of the reference trim range 605 and can read a data value of "1" using a reference trim value at the upper boundary of the reference trim range 605. The accumulated failures for these read operations can correspond to failure boundary points 626. The automated bit line resistance search process can utilize the magnitudes of the failure boundary points 626 to determine a direction to shift in the read characteristics of the magnetoresistive memory device for subsequent read operations. In this example, the automated bit line resistance search process should shift the read characteristics of the magnetoresistive memory device to higher reference resistance values due to the relative magnitudes of the accumulated failures.

Figure 6D:
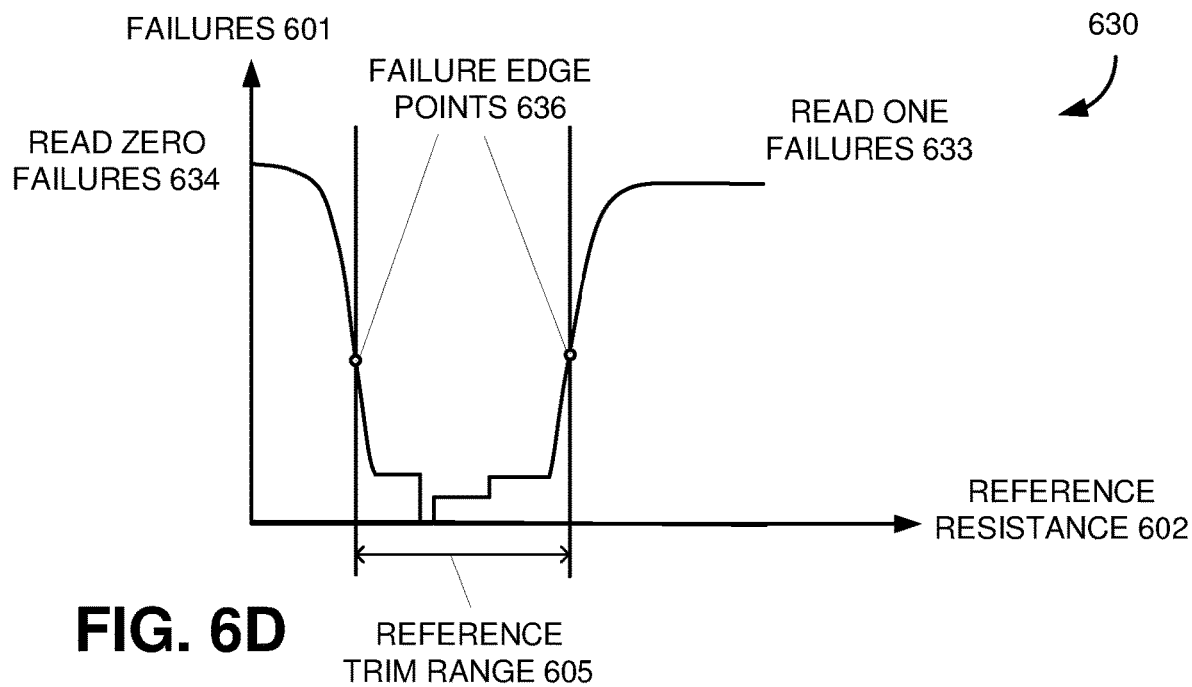

Referring to FIGS. 6D, the graph 630 has an x-axis corresponding to reference resistances 602 used by magnetoresistive memory device during read operations and has a y-axis corresponding to accumulated failures 601 of read operations using the various reference resistances 602. The reference resistances 602 can include a reference trim range 605 corresponding to a set of the reference resistances 602 available to the magnetoresistive memory device during read operations. The magnetoresistive memory device can utilize a reference trim value to select one of the reference resistances 602 within the reference trim range 605 to use during read operations.

In this example, the graph 630 shows read zero failures 634 and read one failures 633, which have been shifted from the read zero failures 624 and read one failures 623, respectively, in FIG. 6C. The read zero failures 634 can correspond to a number of accumulated failures of the memory device to correctly read a data value of "0" using the various reference resistances. The read one failures 633 can correspond to a number of accumulated failures of the memory device to correctly read a data value of "1" using the various reference resistances.

During the automated bit line resistance search process, the magnetoresistive memory device can read a data value of "0" using a reference trim value at the lower boundary of the reference trim range 605 and can read a data value of "1" using a reference trim value at the upper boundary of the reference trim range 605. The accumulated failures for these read operations can correspond to failure boundary points 636. The automated bit line resistance search process can utilize the magnitudes of the failure boundary points 636 to determine a direction to shift in the read characteristics of the magnetoresistive memory device for subsequent read operations. In this example, the automated bit line resistance search process determines that a shift in the read characteristics of the magnetoresistive memory device to lower reference resistance values was previously performed with reference to FIG. 6C, so the automated bit line resistance search process can set the read characteristics of the magnetoresistive memory device to those used in FIG. 6C or FIG. 6D.

Referring back to FIG. 1, after the built-in self-test interface 120 has determined the value for the trim range signal 106, the built-in self-test interface 120 can initiate the automated feedback process to identify a setting for a value of the reference trim within the trim range. The built-in self-test interface 120 can include a trim feedback circuit 124 to perform the automated feedback process by iteratively setting the reference trim signal 105 with different values and utilizing the failures detected by the built-in self-test interface 120 to identify a setting for a value of the reference trim within the trim range.

The trim setting unit 112 and the trim feedback circuit 124 can iterate the process of selecting reference trim values and reading the test data from the memory until the trim feedback circuit 124 identifies a reference trim setting for the type of test data. In some embodiments, the trim feedback circuit 124 can identify a plurality of reference trim settings, for example, one for each data type, such as a low data value and a high data value. The trim feedback circuit 124 can set the value for the reference trim using the identified reference trim settings for the types of test data, for example, aggregating the reference trim settings. Embodiments of the automated feedback process will be described below in greater detail.

Figure 7:
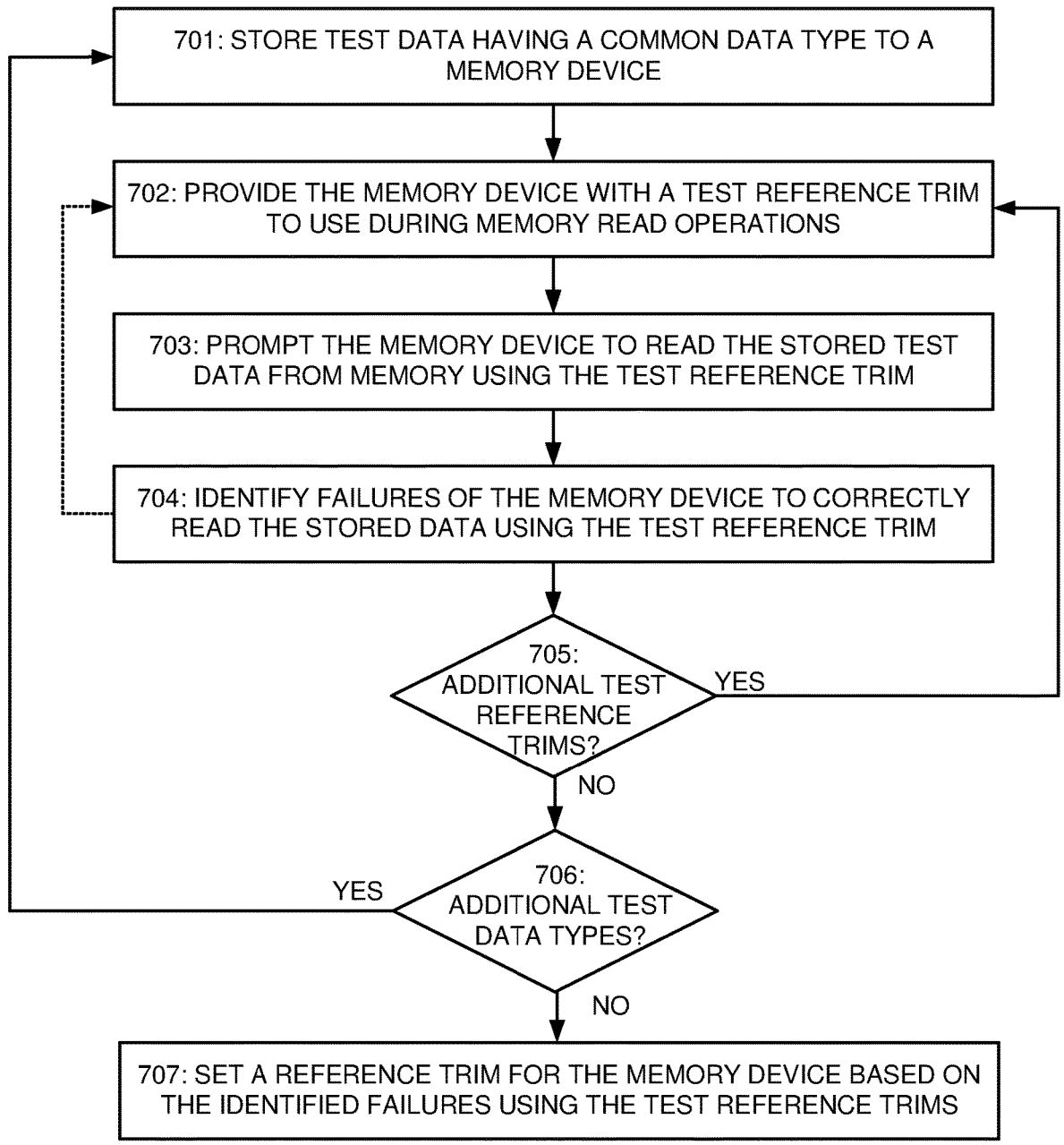
FIG. 7 illustrates a flowchart showing an example implementation of an automated trim feedback process according to various embodiments.

FIG. 7 illustrates a flowchart showing an example implementation of an automated trim feedback process according to various embodiments. Referring to FIG. 7, in block 701, a memory built-in self-test system can provide test data having a common data type to a memory device and prompt the memory device to store the test data. The memory built-in self-test system can write the test data to the memory device by generating a control signal to prompt the memory device to perform data write operations with the test data. In some embodiments, the memory built-in self-test system can write the same data value to memory cells in the memory device, such as all data "1" values or all data "0" values.

In block 702, the memory built-in self-test system can provide the memory device with a test reference trim to use during memory read operations. The memory built-in self-test system can be in a test initiate mode or a test boundary mode. The memory built-in self-test system, in the test initiate mode, can set the test reference trim value to a highest setting or a lowest setting based on the common data type stored in the memory device at the block 701. For example, when the common data type corresponds to a data level of "0", the memory built-in self-test system can set the test reference trim value to a highest setting. Conversely, when the common data type corresponds to a data level of "1", the memory built-in self-test system can set the test reference trim value to a lowest setting.

The memory built-in self-test system, in the test boundary mode, can select a value for the test reference trim based on a binary search process. In some embodiments, the memory built-in self-test system can select the test reference trim value using a different technique or search method.

In block 703, the memory built-in self-test system can prompt the memory device to read the stored test data from memory using the test reference trim. The memory built-in self-test system can generate a control signal to prompt the memory device to perform data read operations. In response to the control signal, the memory device can sense the stored test data and compare the sensed data against a reference value to determine values for the stored test data. In some embodiments, the reference value can correspond to an initial reference value of the memory device, which has been adjusted based on the test reference trim.

In block 704, the memory built-in self-test system can identify failures of the memory device to correctly read the stored data using the test reference trim. The memory built-in self-test system can compare the data read from the memory device against the common data type of the stored data to determine whether the memory device correctly read the stored data using the test reference trim.

The memory built-in self-test system, in the test initiate mode, can accumulate the failures of the memory device to correctly read the stored data using the test reference trim and store them as a hard failure count for the common data type set in the block 701. Execution can return to the block 702, where the memory built-in self-test system can switch to the test boundary mode and select a test reference trim to be provided to the memory device.

The memory built-in self-test system, in the test boundary mode, can accumulate the failures of the memory device to correctly read the stored data using the test reference trim and then compare the accumulated failures against a baseline fail count, for example, read zero fail count at maximum reference trim setting or read one fail count as a minimum reference trim setting. By comparing the accumulated failures against the base line failure counts, the memory built-in self-test system can avoid the influence of hard failures in setting the reference trim value. In some embodiments, the memory built-in self-test system also can accumulate the failures and then compare the accumulated failures against a failure screen threshold to determine a failure result. The failure result, in some examples, can be utilized to set at least a portion of the reference trim for the common data type. By comparing the accumulated failures against the failure screen threshold, the memory built-in self-test system can avoid an influence of low statistical weak bit memory effect and determine a setting for the reference trim with wider read margin. In some embodiments, the memory built-in self-test system, in the test boundary mode, can utilize the results of the comparison to set at one bit of a boundary reference trim value for the common data type.

In block 705, the memory built-in self-test system can determine whether to perform the automated trim feedback process with at least one additional test reference trim. In some embodiments, the search process can include a particular number of iterative searches, with each search using a new test reference trim based, in part, on the failure result of a previous search. When the memory built-in self-test system, in the block 704, partially sets bits of the boundary reference trim value for the common data type, the memory built-in self-test system, in the block 705, can determine whether to perform another search when the boundary reference trim value has not been completely set yet. When another search is to be performed with at least one additional test reference trim, execution can return to the block 702; otherwise execution can proceed to block 706.

In the block 706, the memory built-in self-test system can determine whether to perform the automated trim feedback process with additional test data types. In some embodiments, the memory built-in self-test system can perform the automated trim feedback process with multiple different data types, such as values of "0" and "1", and possibly with one or more other data types. When another search is to be performed with at least one additional data type, execution can return to the block 701; otherwise execution can proceed to block 707. When execution returns to the block 701, the memory built-in self-test system can switch from the test boundary mode to the test initiate mode for the new test data type to be stored to the memory device.

In the block 707, the memory built-in self-test system can set a reference trim for the memory device based on the identified failures using the test reference trims. The memory built-in self-test system can set the reference trim by utilizing the failure results identified in the block 704, for example, to use the values of fail boundary reference trim for each data type, and then aggregating or averaging the fail boundary reference trims for each data type into a final reference trim value. In some embodiments, the memory built-in self-test system can provide the final reference trim value to the memory device for use in subsequent memory read operations.

Figure 8A:
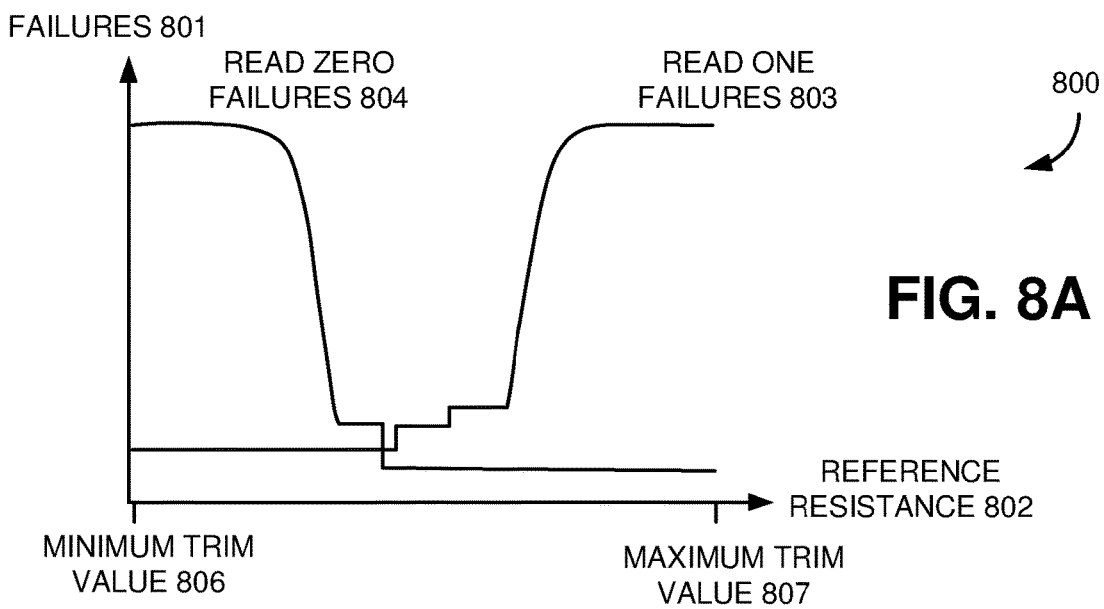
FIGS. 8A-8C illustrate graphs of an example trim reference selection results using different failure thresholds according to various embodiments.

FIG. 8A illustrates a graph of example memory device failures at different sensing reference values according to various embodiments. Referring to FIG. 8A, the graph 800 has an x-axis corresponding to reference resistances 802 used by magnetoresistive memory device during read operations and has a y-axis corresponding to accumulated failures 801 of read operations using the various reference resistances 802. The reference resistances 802 can range between the minimum trim value 806 and the maximum trim value 807, which correspond to a lowest value of the reference trim and a highest value of the reference trim, respectively.

In the instant example, the magnetoresistive memory device can have an array of memory cells, one or more of which may fail regardless of the value of the reference trim. For instance, when one or more failures in the magnetoresistive memory device corresponds to read zero failures, the accumulated failures 801 may not reached to zero at the maximum trim value 807. The accumulated failures 801 at the maximum trim value 807, in some embodiments, can correspond to a baseline read zero fail count present regardless of the reference trim value. Since the read zero failures at the maximum trim value 807 can correspond to minimum level of read zero failures regardless of the reference trim value, the accumulated failures 801 at the maximum trim value 807 may not be considered when setting the reference trim value based on read zero failures.

When one or more failures in the magnetoresistive memory device corresponds to read one failures, the accumulated failures 801 may not reached to zero at the minimum trim value 806. The accumulated failures 801 at the minimum trim value 806, in some embodiments, can correspond to a baseline read one fail count present regardless of the reference trim value. Since the read one failures at the minimum trim value 806 can correspond to minimum level of read one failures regardless of the reference trim value, the accumulated failures 801 at the minimum trim value 806 may not be considered when setting the reference trim value based on read one failures.

In this example, the graph 800 shows read zero failures 804 and read one failures 803. The read zero failures 804 can correspond to a number of accumulated failures of the memory device to correctly read a data value of "0" using the various reference resistances. The read zero failures 804 show a high number of failures when the reference trim is closer to the minimum trim value 806, and a low number of failures when the reference trim is closer to the maximum trim value 807. The read one failures 803 can correspond to a number of accumulated failures of the memory device to correctly read a data value of "1" using the various reference resistances. The read one failures 803 show a lower number of failures when the reference trim is closer to the minimum trim value 806, and a higher number of failures when the reference trim is closer to the maximum trim value 807.

An example of automated trim value search using failure tails is described below with reference to FIG. 8B. In some embodiments, the trim feedback circuit 300 can implement an automated trim value search using failure cliffs as the failure threshold 302. An example of automated trim value search using failure cliffs is described below with reference to FIG. 8C.

Figure 8B:
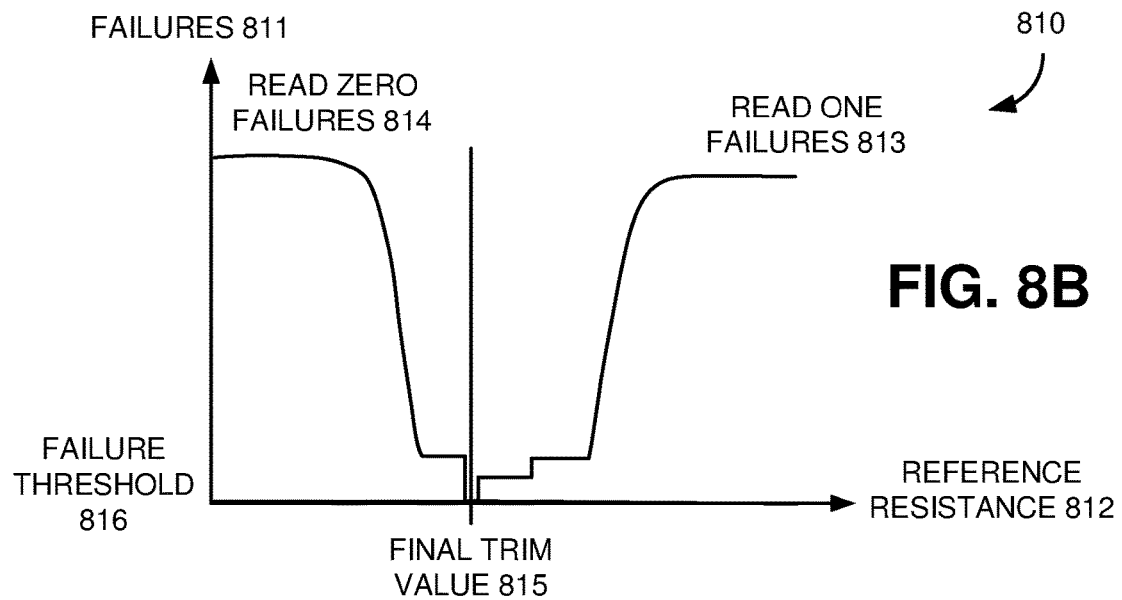
Figure 8C:
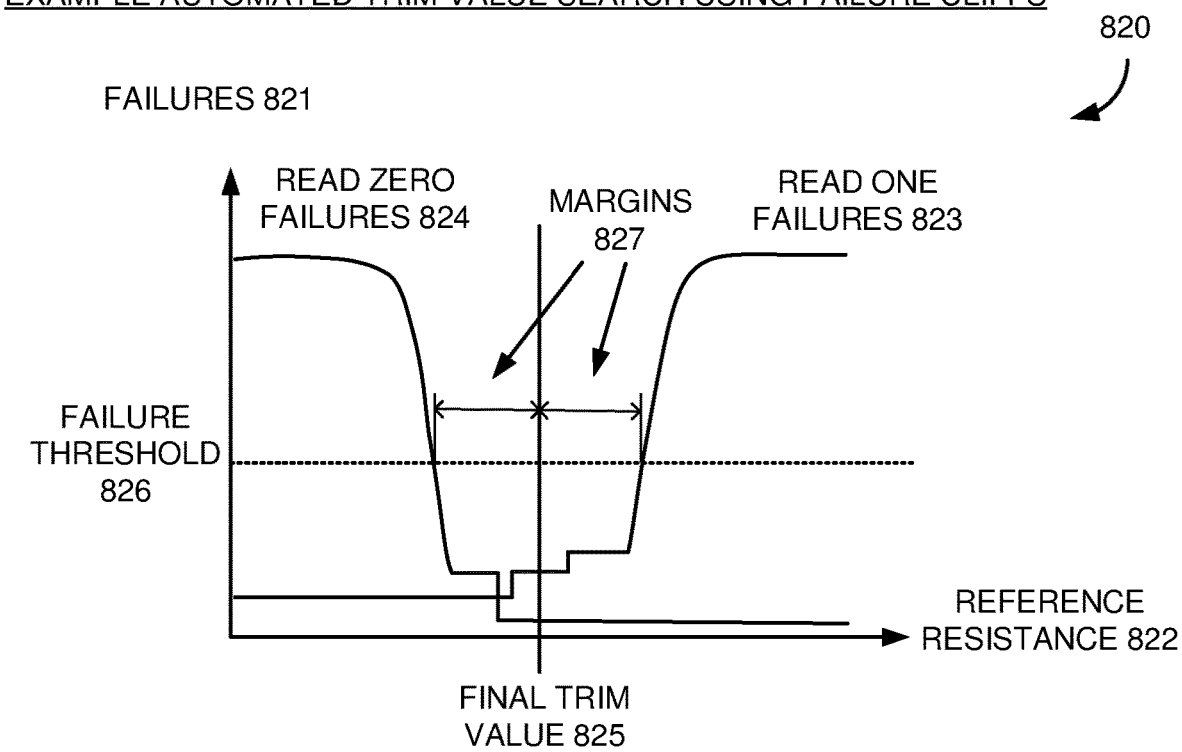

FIGS. 8B and 8C illustrate graphs of example trim reference selection results using different failure thresholds according to various embodiments. Referring to FIG. 8B, the graph 810 has an x-axis corresponding to reference resistances 812 used by magnetoresistive memory device during read operations and has a y-axis corresponding to accumulated failures 811 of read operations using the various reference resistances 812. The reference resistances 812 can correspond to an initial reference resistance combined with various reference trim values.

In this example, the graph 810 shows read zero failures 814 and read one failures 813. The read zero failures 814 can correspond to a number of accumulated failures of the memory device to correctly read a data value of "0" using the various reference resistances. The read zero failures 814 show a high number of failures when closer to a smaller reference trim value, and a low number of failures when closer to a large reference trim value. The read one failures 813 can correspond to a number of accumulated failures of the memory device to correctly read a data value of "1" using the various reference resistances. The read one failures 813 show a low number of failures when closer to a smaller reference trim value, and a high number of failures when closer to a large reference trim value.

A trim feedback circuit implementing an automated trim value search using failure tails shown in FIG. 8B can set a failure threshold 816 to the failure tails corresponding to a low-level of failures for the read zero failures 814 and read one failures 813. In some embodiments, the read zero failures 814 can be a difference between the accumulated read zero failures 804 at the different reference resistances 802 shown in FIG. 8A and the accumulated read zero failures 804 at the maximum trim value 807 shown in FIG. 8A. The read one failures 813 can be a difference between the accumulated read one failures 803 at the different reference resistances 802 shown in FIG. 8A and the accumulated read one failures 803 at the minimum trim value 806 shown in FIG. 8A. In some embodiments, the trim feedback circuit can determine fail bit count while reading data values of "0" from a memory device using a maximum reference trim, for example, providing a small number of bit failures, and set the failure threshold 816 for data values of "0" to the fail bit count. The trim feedback circuit also can determine fail bit count while reading data values of "1" from the memory device using a minimum reference trim, for example, providing a small number of bit failures, and set the failure threshold 816 for data values of "1" to the fail bit count. The trim feedback circuit can perform the automated search for a final trim value 815 using the failure thresholds 816.

Referring to FIG. 8C, the graph 820 has an x-axis corresponding to reference resistances 822 used by magnetoresistive memory device during read operations and has a y-axis corresponding to accumulated failures 821 of read operations using the various reference resistances 822. The reference resistances 822 can correspond to an initial reference resistance combined with various reference trim values.

In this example, the graph 820 shows read zero failures 824 and read one failures 823. The read zero failures 824 can correspond to a number of accumulated failures of the memory device to correctly read a data value of "0" using the various reference resistances. The read zero failures 824 show a high number of failures when closer to a smaller reference trim value, and a low number of failures when closer to a large reference trim value. The read one failures 823 can correspond to a number of accumulated failures of the memory device to correctly read a data value of "1" using the various reference resistances. The read one failures 823 show a low number of failures when closer to a smaller reference trim value, and a high number of failures when closer to a large reference trim value.

A trim feedback circuit can implement an automated trim value search using failure cliffs shown in FIG. 8C. The trim feedback circuit can perform the automated search to identify boundary trim values, for example, where the read one failure count and the read zero failure count exceed a failure threshold 826. The failure threshold 826 can correspond to a level of failures capable of being repaired, for example, using redundant row-based repair and/or redundant column-based repair, or corrected, for example, using a read data correction with an error correction control (ECC) process. In some embodiments, the failure threshold 826 can be set by the trim feedback circuit, for example, in response to user input. The trim feedback circuit can utilize the boundary trim values to select a final trim value 825 for the magnetoresistive memory device. The final trim value 825 can be different than the final trim value 815 shown in FIG. 8B. The final trim value 815 in FIG. 8B can correspond to common low point of the read zero failures 814 and the read one failures 813, while the final trim value 825 can have larger margins 827 from the intersections of the failure threshold 826 with the read zero failures 824 and the read one failures 823.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

Conclusion

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A system comprising:
 a memory device configured to sense values of stored data using a reference trim during memory read operations; and
 a memory built-in self-test system configured to prompt the memory device to perform a plurality of the memory read operations with different locations for a range of available values of the reference trim relative to read characteristics of the memory device and with multiple values for the reference trim with the range, wherein the memory built-in self-test system is configured to set a location for the range of available values of the reference trim relative to the read characteristics of the memory device based, at least in part, on failures of the memory device to correctly sense the stored data during the memory read operations with the different locations for the range of available values of the reference trim, and wherein the memory built-in self-test system is further configured to set the reference trim for the memory device within the range of available values of the reference trim.

2. The system of claim 1, wherein the memory built-in self-test system is configured to perform the plurality of the memory read operations by iteratively shifting the range of available values of the reference trim relative to the read characteristics of the memory device.

3. The system of claim 2, wherein the memory built-in self-test system is configured to iteratively shift the range of available values of the reference trim based, at least in part, on relative magnitudes of memory read failures by the memory device using values for the reference trim at boundaries of the range of available values of the reference trim.

4. The system of claim 1, wherein the memory built-in self-test system is configured to perform the plurality of the memory write and read operations by iteratively shifting the read characteristics of the memory device relative to the range of available values of the reference trim.

5. The system of claim 4, wherein the memory built-in self-test system is configured to iteratively shift the read characteristics of the memory device based, at least in part, on relative magnitudes of memory read failures by the memory device using values for the reference trim at boundaries of the range of available values of the reference trim.

6. The system of claim 1, wherein the memory device is a Magnetoresistive Random Access Memory (MRAM) device.

7. A method comprising:
   prompting, by a memory built-in self-test system-, a memory device to perform a plurality of memory read operations with different positions of a reference trim range relative to read characteristics of the memory device and with multiple values for a reference trim with the reference trim range, wherein the reference trim range corresponds to a range of available values of the reference trim;
   determining, by a memory built-in self-test system, when the memory device fails to correctly sense values of stored data using test values for the reference trim in the different positions of the reference trim range; and
   setting, by the memory built-in self-test system, a position for the reference trim range relative to the read characteristics of the memory device based, at least in part, on failures of the memory device to correctly sense the stored data during the memory read operations with the different positions for the reference trim range; and
   setting, by the memory built-in self-test system, the reference trim for the memory device within the reference trim range having the set position by the memory built-in self-test system.

8. The method of claim 7, wherein prompting the memory device to perform the plurality of the memory read operations includes iteratively shifting the reference trim range relative to the read characteristics of the memory device.

9. The method of claim 8, wherein the iteratively shifting the reference trim range relative to the read characteristics of the memory device is based, at least in part, on relative magnitudes of memory read failures by the memory device using values for the reference trim at boundaries of the range of available values of the reference trim.

10. The method of claim 7, wherein prompting the memory device to perform the plurality of the memory write and read operations includes iteratively shifting the read characteristics of the memory device relative to the reference trim range.

11. The method of claim 10, wherein the iteratively shifting the read characteristics of the memory device relative to the reference trim range is based, at least in part, on relative magnitudes of memory read failures by the memory device using values for the reference trim at boundaries of the range of available values of the reference trim.

12. The method of claim 7, wherein the memory device is a Magnetoresistive Random Access Memory (MRAM) device.

13. An apparatus comprising:
   a memory built-in self-test controller configured to prompt a memory device to perform memory read operations using different positions of a reference trim range relative to read characteristics of the memory device and with multiple values for a reference trim with the reference trim range, wherein the reference trim range corresponds to a range of available values of the reference trim, and wherein the memory device is configured to sense values of stored data using the reference trim during the memory read operations; and
   a trim range circuit configured to determine when the memory device fails to correctly sense the values of the stored data using test values for the reference trim, and set a position for the reference trim range relative to the read characteristics of the memory device based, at least in part, on failures of the memory device to correctly sense the stored data during the memory read operations with the different positions for the reference trim range, and wherein the trim feedback circuit is configured to set the reference trim for the memory device within the reference trim range having the set position by the trim range circuit.

14. The apparatus of claim 13, wherein the memory built-in self-test controller is configured to iteratively shift the reference trim range relative to the read characteristics of the memory device for the memory read operations.

15. The apparatus of claim 14, wherein the memory built-in self-test controller is configured to iteratively shift the reference trim range based, at least in part, on relative magnitudes of memory read failures by the memory device using values for the reference trim at boundaries of the range of available values of the reference trim.

16. The apparatus of claim 13, wherein the memory built-in self-test controller is configured to iteratively shift the read characteristics of the memory device relative to the reference trim range.

17. The apparatus of claim 16, wherein the memory built-in self-test controller is configured to iteratively shift the read characteristics of the memory device based, at least in part, on relative magnitudes of memory read failures by the memory device using values for the reference trim at boundaries of the range of available values of the reference trim.

* * * * *